United States Patent
Kim et al.

(10) Patent No.: US 10,067,821 B2
(45) Date of Patent: Sep. 4, 2018

(54) APPARATUS AND METHOD FOR CYCLIC REDUNDANCY CHECK

(71) Applicant: CENTER FOR INTEGRATED SMART SENSORS FOUNDATION, Daejeon (KR)

(72) Inventors: Hye Ji Kim, Daejeon (KR); Ji Hoon Kim, Seongnam-si (KR)

(73) Assignee: CENTER FOR INTEGRATED SMART SENSORS FOUNDATION, Daejeon (KR)

(*) Notice: Subject to any disclaimer, the term of this patent is extended or adjusted under 35 U.S.C. 154(b) by 0 days.

(21) Appl. No.: 15/184,723

(22) Filed: Jun. 16, 2016

(65) Prior Publication Data

US 2016/0371142 A1 Dec. 22, 2016

(30) Foreign Application Priority Data

Jun. 16, 2015 (KR) .................. 10-2015-0084788

(51) Int. Cl.
| | |
|---|---|
| *G06F 11/10* | (2006.01) |
| *G06F 7/58* | (2006.01) |
| *H04L 29/08* | (2006.01) |
| *G06F 7/72* | (2006.01) |

(52) U.S. Cl.
CPC .......... *G06F 11/1004* (2013.01); *G06F 7/584* (2013.01); *G06F 7/724* (2013.01); *H04L 69/324* (2013.01); *G06F 2207/581* (2013.01)

(58) Field of Classification Search
CPC ...... G06F 11/1004; G06F 7/584; G06F 7/724; G06F 2207/581; H04L 69/324
See application file for complete search history.

(56) References Cited

U.S. PATENT DOCUMENTS

| | | | | |
|---|---|---|---|---|
| 5,912,881 A | * | 6/1999 | Glaise ................. | H03M 13/091 370/252 |
| 6,189,124 B1 | * | 2/2001 | Glaise ................. | H03M 13/091 714/758 |
| 9,009,565 B1 | * | 4/2015 | Northcott ............... | G11C 29/42 365/185.09 |
| 9,026,867 B1 | * | 5/2015 | Northcott ............ | G06F 11/1048 365/185.09 |

* cited by examiner

*Primary Examiner* — Kyle Vallecillo
(74) *Attorney, Agent, or Firm* — Erik Huestis; Foley Hoag LLP

(57) ABSTRACT

An apparatus and method for cyclic redundancy check device is provided. The apparatus includes a multiplicity of sub-block CRC parts configured to receive a bit sequence from each sub-block of a transport block that is divided into a multiplicity of sub-blocks and to perform CRC, and a Galois field adding part configured to add second codes, which are output from the multiplicity of sub-block CRC parts, in a Galois field, wherein each sub-block CRC part includes a Galois field multiplying part configured to generate a weight bit sequence by multiplying a first code, which is obtained from CRC calculation of a sub-block weight code that represents a weight allocated to each sub-block, and the bit sequence in the Galois field, and a linear feedback shift register including n-numbered registers and configured to output the second code by adding the weight bit sequence to each register in the Galois field.

7 Claims, 9 Drawing Sheets

FIG. 4C

| Clock cycle | CRC[$A_2(x) \cdot x^{12}$] Process ||| CRC[$A_1(x) \cdot x^6$] Process ||| CRC[$A_0(x) \cdot x^0$] Process |||
|---|---|---|---|---|---|---|---|---|---|
| | $A_2(x)$ | GF mult | LFSR out | $A_1(x)$ | GF mult | LFSR out | $A_0(x)$ | GF mult | LFSR out |
| 1 | 1 | [000101] | [000101] | 1 | [000011] | [000011] | 1 | [000001] | [000001] |
| 2 | 0 | [000000] | [001010] | 1 | [000011] | [000101] | 1 | [000001] | [000011] |
| 3 | 1 | [000101] | [010001] | 0 | [000000] | [001010] | 1 | [000001] | [000111] |
| 4 | 1 | [000101] | [000111] | 0 | [000000] | [010100] | 1 | [000101] | [001111] |
| 5 | 1 | [000000] | [001101] | 1 | [000011] | [101011] | 0 | [000000] | [011110] |
| 6 | 1 | [000101] | [011111] | 0 | [000000] | [010101] | 1 | [000001] | [111101] |

FIG. 5C

| Clock cycle | CRC[$A_2(x) \cdot x^{12}$] Process | | | CRC[$A_1(x) \cdot x^6$] Process | | | CRC[$A_0(x) \cdot x^0$] Process | | |
|---|---|---|---|---|---|---|---|---|---|
| | $A_2(x)$ | GF mult | LFSR out | $A_1(x)$ | GF mult | LFSR out | $A_0(x)$ | GF mult | LFSR out |
| 1 | 10 | [001010] | [001010] | 1 | [000101] | [000101] | 1 | [000011] | [000011] |
| 2 | 11 | [000111] | [1001110] | 1 | [000000] | [000100] | 1 | [000011] | [001111] |
| 3 | 01 | [000101] | [011111] | 0 | [000110] | [000101] | 1 | [000001] | [111101] | ated herein
APPARATUS AND METHOD FOR CYCLIC REDUNDANCY CHECK

BACKGROUND

Embodiments of the inventive concept described herein relate to an apparatus and method for cyclic redundancy check.

Cyclic redundancy check (CRC) is an operation mode using a cyclic binary code for detecting an error which is generated during data transmission. CRC is usually performed by dividing data into units of blocks at a transmission station, by adding a cyclic sign, which is obtained through calculation of a polynomial after the blocks, in surplus to the data, and by transmitting the sign-added data. For this, a reception station calculates the received data in the same polynomial with the transmission station and then finds a transmission error from whether the same cyclic sign is obtained as done the transmission state.

A general CRC apparatus takes a very long time for completing CRC due to the serial characteristics of CRC mode, reducing an amount of processing data.

SUMMARY

Embodiments of the inventive concept provide an apparatus and method for CRC, shortening a time for CRC to increase energy efficiency and an amount of processing data.

In accordance with an aspect of the inventive concept, an apparatus for cyclic redundancy check (CRC) operating with a polynomial having n degrees may include a multiplicity of sub-block CRC parts configured to receive a bit sequence from each sub-block of a transport block that is divided into a multiplicity of sub-blocks and to perform CRC, and a Galois field adding part configured to add second codes, which are output from the multiplicity of sub-block CRC parts, in a Galois field, wherein each sub-block CRC part may include a Galois field multiplying part configured to generate a weight bit sequence by multiplying a first code, which is obtained from CRC calculation of a sub-block weight code that represents a weight allocated to each sub-block, and the bit sequence in the Galois field, and a linear feedback shift register including n-numbered registers and configured to output the second code by adding the weight bit sequence to each register in the Galois field.

If an order of a sub-block is P and a size of the sub-block is N, the number of bit of a sub-block weight code of the sub-block may be $(P-1) \times N+1$, a most significant bit of the sub-block weight code may be 1, and the rest bits of the sub-block weight code may be 0.

If a size of a sub-block is N and an order of a corresponding sub-block of the transport block is P, the apparatus may further include a storage unit configured to store a reference weight CRC code that is preliminarily obtained through CRC calculation of a code that has the number of bits of N+1, a most significant bit of 1, and the rest bits of 0, and a first code generating part configured to generate a first code from a corresponding sub-block by multiplying the reference weight CRC codes, which are counted by subtracting 1 from P, in the Galois field.

Provided a size of the bit sequence is S, if S=1, the linear feedback shift register may be a 1-bit serial linear feedback shift register that calculates 1 bit per one cycle, and if S>1, the linear feedback shift register may be an S-bit parallel linear feedback shift register that calculates S bits per one cycle.

In accordance with another aspect of the inventive concept, a method for CRC operating with a polynomial having n degrees may include receiving a bit sequence from each sub-block of a transport block that is divided into a multiplicity of sub-blocks, generating a weight bit sequence by multiplying a first code, which is obtained from CR calculation of a sub-block weight code that represents a weight allocated to each sub-block, and the bit sequence in a Galois field, outputting a second code by adding the weight bit sequence to n-numbered registers, which are included a linear feedback shift register, in the Galois field, and adding the second codes to the multiplicity of sub-blocks in the Galois field.

The generating of the weight bit sequence may further include invoking a reference weight CRC code, which is obtained by CRC-calculating of a code that has the number of bits of N+1, a most significant bit of 1, and the rest bits of 0, from a storage unit, and generating a first code of a corresponding sub-block by multiplying the reference the weight CRC codes, which are counted by subtracting 1 from P, in the Galois field.

In accordance with still another aspect of the inventive concept, a method for CRC may be implemented in a computer program stored in a medium for the purpose of execution in connection with a computer.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4C is a table showing a calculation process of a 1-bit serial linear feedback shift register according to an embodiment of the inventive concept;

FIG. 5C is a table showing a calculation process of a 1-bit serial linear feedback shift register according to an embodiment of the inventive concept.

DETAILED DESCRIPTION

Figure 1:
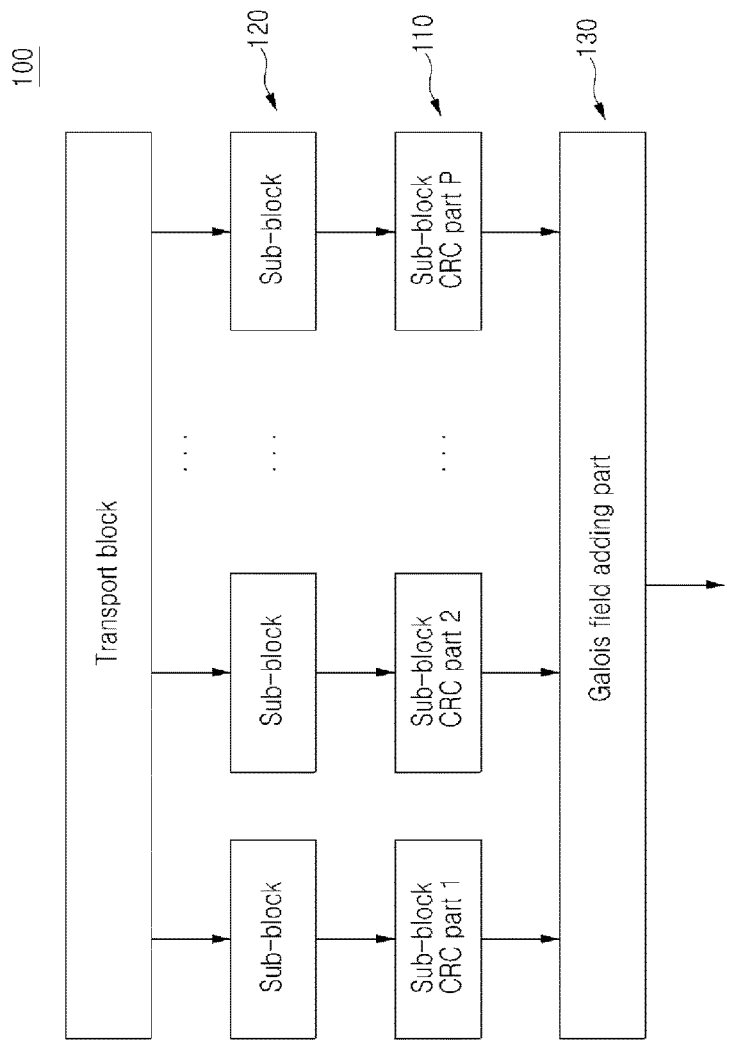
FIG. 1 is a block diagram exemplarily illustrating an apparatus for CRC according to an embodiment of the inventive concept.

Other aspects, advantages, and salient features of the present disclosure will become apparent to those skilled in the art from the following detailed embodiments. Various embodiments described herein, however, may not be intentionally confined in specific embodiments, but should be construed as including diverse modifications, equivalents, and/or alternatives. Various embodiments are merely provided to help those skilled in the art to clearly understand the technical scope of the inventive concept and the present disclosure may be only defined by the scope of the annexed claims.

Unless otherwise defined herein, all the terms used herein (including technical or scientific terms) may have the same meaning that is generally acceptable by universal technology in the related art of the inventive concept. It will be further understood that terms, which are defined in a dictionary and commonly used, may also be interpreted as is customary in the relevantly related art and/or as is same in the description of the present application. Even in the case of terminological expression with insufficient clarification, such terms may not be conceptualized or overly interpreted in formality.

In the description, the terms of a singular form may also include plural forms unless otherwise specified. The terms 'include' and/or its diverse inflections or conjugations, for example, 'inclusion', 'including', 'includes', or 'included', as used herein, may be construed such that any one of a constitution, a component, an element, a step, an operation, and/or a device does not exclude presence or addition of one or more different constitutions, components, elements, steps, operations, and/or devices. Additionally, the term 'and/or' may be understood as indicating respective ones of elements or any one of various combinations between the elements.

As used herein, the terms '~part', '~or (er)', '~block', or '~module' may mean a unit of processing at least one function or operation. For example, the terms may mean software or a hardware element such as FPGA or ASIC, but may not be restrictive to such software or hardware. Such an element named as '~part', '~or (er)', '~block', or '~module' may be configured in an addressable storage medium, or even configured to actuate one or more processors.

As an example, '~part', '~or (er)', '~block', or '~module' may include software elements, object-oriented software elements, class elements, task elements, processes, functions, properties, procedures, sub-routines, segments of a program code, drivers, firmware, micro-codes, circuits, data, databases, data structures, tables, arrays, and parameters. Functions provided to elements, '~part', '~or (er)', '~block', or '~module' may be coupled with a smaller number of elements, '~parts', '~ors (ers)', '~blocks', or '~modules', or may be further divided into additional elements, '~parts', '~ors (ers)', '~blocks', or '~modules'

Hereafter, embodiments of the inventive concept will be described in conjunction with the accompanied figures.

FIG. 1 is a block diagram exemplarily illustrating an apparatus 100 for CRC according to an embodiment of the inventive concept.

As illustrated in FIG. 1, the CRC apparatus 100 may include a multiplicity of sub-block CRC parts 110 and a Galois field adding part 130.

The sub-block CRC part 110 may CRC-check sub-blocks which are divided from a transport block. The transport block may be divided into a multiplicity of sub-blocks and the multiplicity of sub-block CRC parts 110 receives bit sequences respectively from respective sub-blocks.

According to an embodiment, the transport block may be divided into a multiplicity of sub-blocks and may be decoded in parallel in a parallel decoder, e.g., a turbo decoder. For example, the parallel decoder may coincidently decode the multiplicity of sub-blocks.

According to an embodiment, the sub-block CRC part 110 may receive bit sequences from a high-radix parallel decoder and may CRC-check the received bit sequences.

The high-radix parallel decoder may decode received data and then may coincidently output a multiplicity of bit sequences. A radix-M parallel decoder may coincidently output $\log_2 M$ bit sequences. For example, a radix-4 parallel decoder may coincidently output 2 bit sequences and a radix-16 parallel decoder may coincidently output 4 bit sequences. As a result, the sub-block CRC part 110 may receive $\log_2 M$ bit sequences from the radix-M parallel decoder 100 and may CRC-check the received $\log_2 M$ bit sequences.

The Galois field adding part 130 may add codes, which are output from the multiplicity of sub-block CRC part 110, in a Galois field. According to an embodiment, the Galois field adding part 130 may be implemented using an XOR gate.

Figure 2:
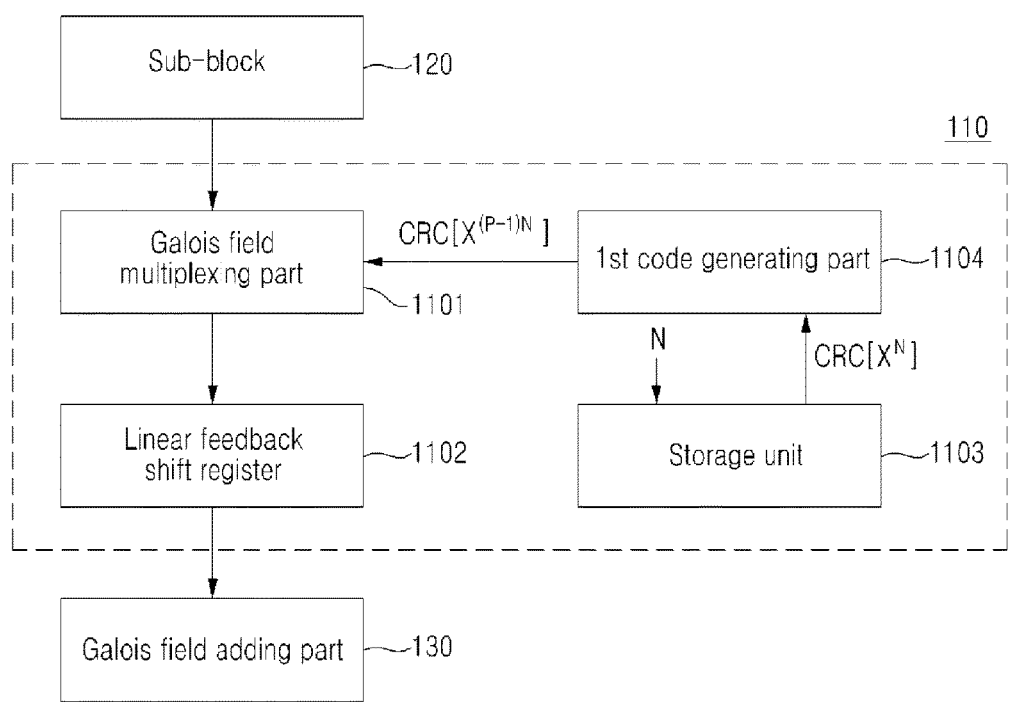
FIG. 2 is a diagram illustrating a sub-block CRC part of an apparatus for CRC, in detail, according to an embodiment of the inventive concept.

FIG. 2 is a diagram illustrating a sub-block CRC part 110 of an apparatus for CRC, in detail, according to an embodiment of the inventive concept.

As illustrated in FIG. 2, each sub-block CRC part 110 may include a Galois field multiplying part 1101 and a linear feedback shift register 1102.

The Galois field multiplying part 1101 may generate a weight bit sequence by multiplying a bit sequence, which is received from each sub-block, and a first code in the Galois field. The first code may be obtained through CRC calculation of a sub-block weight code which represents a weight allocated to each sub-block.

The sub-block weight code may have the number of bits of $$(P-1) \times N + 1,$$

and may have the most significant bit of 1. The rest bits of the sub-block weight code may be 0. In the equation, N denotes a size of a corresponding sub-block and P denotes an order of a corresponding sub-block of a transport block.

For example, when a transport block is given as A(x)=[101101110010111101], the transport block A(x) may be divided into three sub-blocks Sub-block 3 ([101101]), Sub-block 2 ([110010]), and Sub-block 1 ([111101]). Orders of the sub-blocks may increase toward the most significant bit from the least significant bit in the transport block. A sub-block weight code of Sub-block 2 may have the number of bits of (2−1)·6+1=7 and may be [1000000] in which the most significant bit is 1 and the rest bits are 0. [1000000] may be processed through CRC calculation with a CRC generation code [1000011] to obtain a first code [000011] to the Sub-block 2. The CRC generation code may be variable in accordance with embodiments.

The linear feedback shift register 1102 may receive the weight bit sequence and then may output a second code. A Galois field adding part 130 may output a CRC code by adding second codes, which are output from a multiplicity of sub-block CRC part 110, in the Galois field. An operation of the feedback shift register 1102 will be detailed later in conjunction with FIGS. 4A to 5C.

Referring to FIG. 2, each sub-block CRC part 110 may further include a storage unit 1103 and a first code generating part 1104.

When a size of the sub-block is N, the storage unit 1103 may preliminarily calculate and store a reference weight CRC code which is obtained through CRC calculation of a code in which the number of bits is N+1, the most significant bit is 1, and the rest bits are 0.

For example, a reference weight code of Sub-blocks 1 to 3 may be [000011] which is obtained through CRC calculation of [1000000], which has the number of bits 6+1=7, the most significant bit of 1, and the rest bits of 0, with a CRC generation code [100011]. As also, the CRC generation code may be variable in accordance with embodiments.

According to an embodiment, the storage unit 1103 may include a register and the reference weight CRC code may be formed of a lookup table. However, the storage unit may not be restrictive in a kind and may even include a storage element such as memory.

When an order of a corresponding sub-block of a transport block is P, the first code generating part 1104 may generate a first code to the corresponding sub-block by multiplying the reference weight CRC codes, which are counted by subtracting 1 from P, in the Galois field.

As an example, to generate a first code to Sub-block 3, the first code generating part 1104 may invoke a reference weight CRC code ([000011]) from the storage unit and then may multiply two reference weight codes, which are counted by subtracting 1 from 3 that is an order of Sub-block 3, in the Galois field (i.e., the reference weight CRC code of Sub-block 3=[000011] ⊗ [000011], where ⊗ denotes a Galois field multiplication operator).

Figure 3:
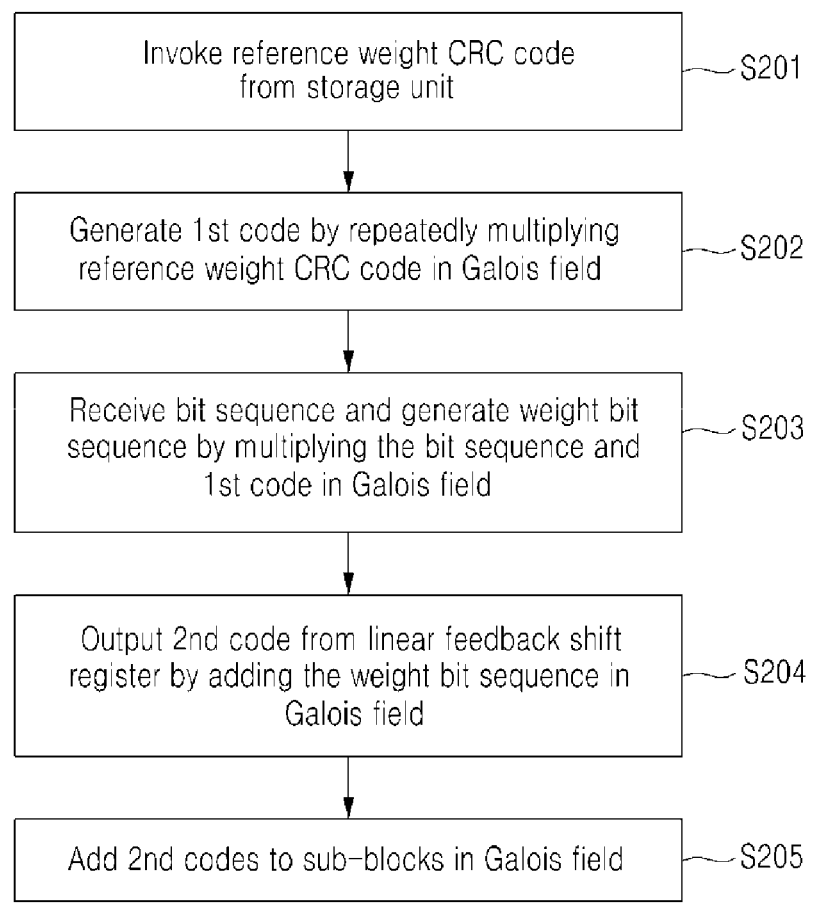
FIG. 3 is an exemplary flow chart showing a method for CRC according to an embodiment of the inventive concept.

FIG. 3 is an exemplary flow chart showing a method 200 for CRC according to an embodiment of the inventive concept.

The CRC method 200 may be performed through a CRC apparatus 100 described above according to an embodiment of the inventive concept.

As illustrated in FIG. 3, the CRC method 200 may include steps of receiving a bit sequence and multiplying a first code and the received bit sequence in a Galois field to generate a weight bit sequence (S203), outputting a second code from a linear feedback shift register by adding the weight bit sequence in the Galois field (S204), and adding second codes of a multiplicity of sub-blocks in the Galois field (S205). The step of outputting the second code (S204) will be detailed later in conjunction with FIGS. 4A to 5C.

According to an embodiment, the step S203 may include a step of receiving the bit sequence from a high-radix parallel decoder which decodes sub-blocks which are divided from a transport block.

The high-radix parallel decoder may be a radix-4 parallel decoder, but the parallel decoder may not be restrictive in degrees of radix.

According to an embodiment of the inventive concept, the CRC method 200 may include steps of invoking a reference weight CRC code from a storage unit (S201), and generating a first code of a sub-block by repeatedly multiplying the reference weight CRC code in a Galois field (S202).

According to an embodiment, the reference weight CRC code has the number of bits equal to a value that is made by summing up 1 into a size of a sub-block, in which the most significant bit may be 1 and the rest bits may be composed of 0.

According to an embodiment, the step S202 of generating a first code of the sub block may include a step of multiplying reference weight CRC codes, which are counted by subtracting 1 from an order of a corresponding sub-block of a transport block, in the Galois field.

According to an embodiment of the inventive concept, the step S201 and the step S202 may be performed before the step 203.

Hereafter, FIGS. 4A to 5C will be now referred to describe a calculation process for outputting a second code from a linear feedback shift register 1102 which receives a weight bit sequence from a Galois field multiplying part 1101.

In embodiments shown in FIGS. 4A to 5C, a CRC generation polynomial and a CRC generation code, which are used in the CRC part 100, may be given as g(x) as follows, and a CRC bit width may be assumed as 6 bits. Additionally, a transport block may be assumed as being given like C(x) as follows.

$$g(x) = x^6 + x + 1 = [1000011]_2$$

$$C(x) = [101101110010111101]_2$$

The transport block C(x) may be divided into a multiplicity of sub-blocks. The multiplicity of sub-blocks may be coincidently processed in parallel through a CRC apparatus 100 according to an embodiment of the inventive concept.

C(x) may be divided into 3 sub-blocks. Although the divided sub-blocks are exemplified as having the same size of 6, embodiments of the inventive concept may not be restrictive to the same size for all of the divided sub-blocks. The divided sub-blocks may be all different in sizes.

$$A_2(x) = [101101], A_1(x) = [110010], A_0(x) = [111101]$$

Orders P of the sub-blocks $A_2(x)$, $A_1(x)$, and $A_0(x)$ may become 3, 2, and 1, respectively. As the size N of the sub-blocks is the same as 6, weight codes of the sub-blocks are [1000000000000], [1000000], and [1] respectively. A result of calculating a first code respectively to the sub-blocks by CRC-calculating the sub-block weight codes with CRC generation codes may be given as follows.

$$CRC[x^{12}] = [000101], CRC[x^6] = [000011]. CRC[x^0] = [000001]$$

Hereafter, a calculation process of a linear feedback shift register will be described in two cases of dividing the transport block C(x) into a bit sequence of 1-bit data to each sub-block, and dividing the transport block C(x) into a bit sequence of 2-bit data to each sub-block.

Figure 4A:
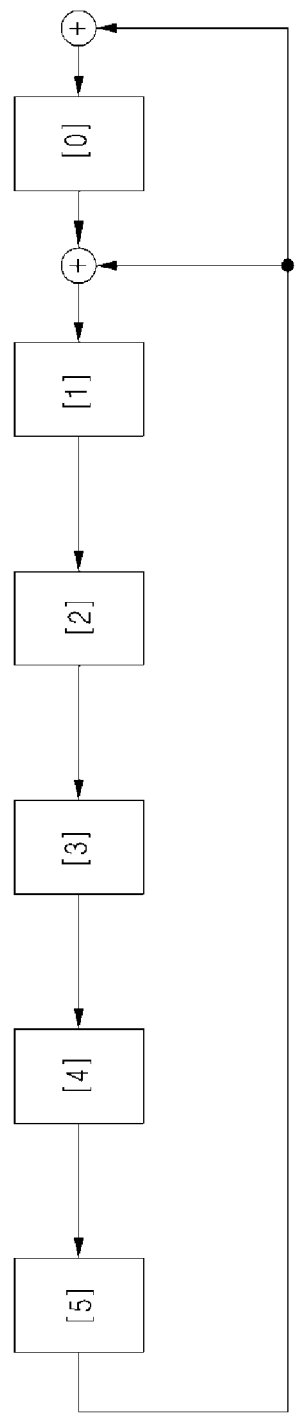
FIG. 4A is a block diagram exemplarily illustrating a 1-bit serial linear feedback shift register.
Figure 4B:
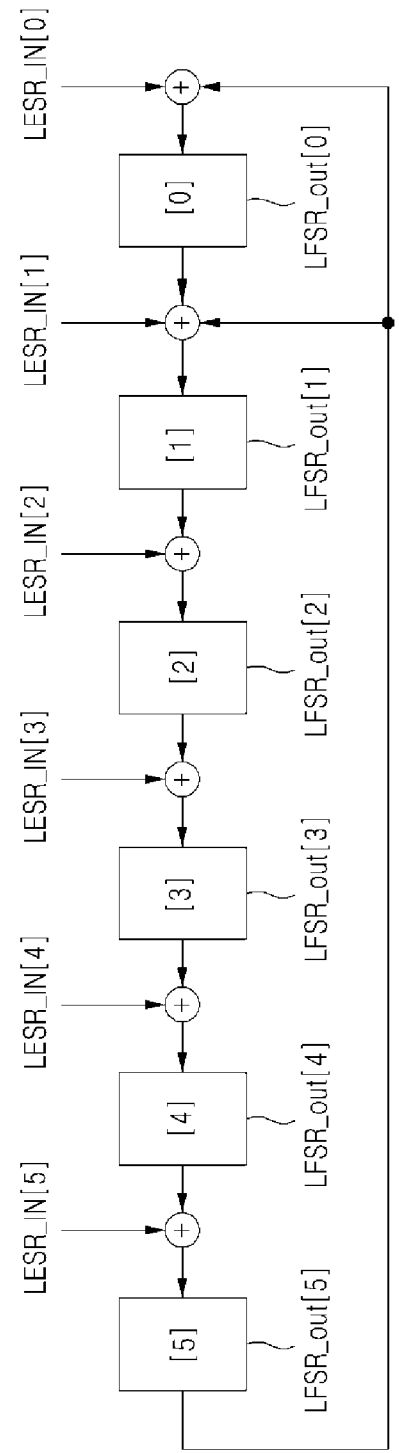
FIG. 4B is a diagram illustrating a scheme of inputting a weight bit sequence into a 1-bit serial linear feedback shift register according to an embodiment of the inventive concept.

Referring to FIGS. 4A to 4C, in the case that data processed in one cycle by a linear feedback shift register according to an embodiment of the inventive concept is 1 bit, a calculation process of the linear feedback shift register will be described in detail. In this process, the linear feedback shift register may be a 1-bit serial linear feedback shift register.

In the case that a characteristic polynomial is $$g(x) = x^6 + x + 1,$$

FIG. 4A illustrates a 1-bit serial linear feedback shift register. As registers having outputs affecting inputs are ordered in 0 and 5, the characteristic polynomial may be given as the g(x).

FIG. 4B illustrates a 1-bit serial linear feedback shift register included in a CRC apparatus 100 according to an embodiment of the inventive concept, in which an input value to each register may be added in a Galois field and then may be shifted by 1 bit every cycle after XOR calculation.

FIG. 4C is a table showing a calculation process of a 1-bit serial linear feedback shift register. As illustrated in FIG. 2, a value input into the linear feedback shift register 1102 may be an output of a Galois field multiplying part 1101. As illustrated in FIG. 4C, a transport block C(x) may be divided into a multiplicity of sub-blocks and the multiplicity of sub-blocks are processed at the same time.

The divided sub-blocks may be divided into 6 bit sequences, respectively. For example, $A_2(x)$ may be divided into [1], [0], [1], [1], [0], and [1]. Each bit sequence may be input into the Galois field multiplying part 1101. The Galois field multiplying part 1101 may multiply a bit sequence and a first code in a Galois field to generate a weight bit sequence which is made by applying a weight of a corresponding sub-block to each bit sequence.

A weight bit sequence of $A_2(x)$, i.e., an output of the Galois field multiplying part 1101, may be input one by one every cycle (clock cycle, T) into the linear feedback shift register. As a result, the 1-bit serial linear shift register may process 1-bit data every cycle. Input values may be represented as follows in consideration that the weight bit sequence is input and calculated in the linear feedback shift register.

$T=1)[00010100000]$ $T=2)[00000000000]$ $T=3)[00000101000]$ $T=4)[00000010100]$ $T=5)[00000000000]$ $T=6)[00000000101]$

As an input value to each register of the 1-bit serial linear feedback shift register is shifted by 1 bit every cycle, the input value may be the same with the shadow section in the weight bit sequence, i.e., the column of 'GF mult' in the table of FIG. 4C.

In implementing a practical hardware structure, because there is no input of data '0', practical hardware expressions of the input values of the linear feedback shift register may be represented as shown in the following Table 1.

TABLE 1

| T | 1 | 2 | 3 | 4 | 5 | 6 |
|---|---|---|---|---|---|---|
|   | 101 | 0 | 0 | 0 | 0 | 0 |
|   |   | 000 | 0 | 0 | 0 | 0 |
|   |   |   | 101 | 0 | 0 | 0 |
|   |   |   |   | 101 | 0 | 0 |
|   |   |   |   |   | 000 | 0 |
|   |   |   |   |   |   | 101 |

Calculation of a linear feedback shift register may continue until the last data to each block is input and processed (T=6), and a calculated value of the last data may be output as a second code. Referring to FIG. 4C, a value of LFSR out at the last cycle may be a second code of a corresponding sub-block. As an example, a linear feedback shift register may receive a weight bit sequence of the sub-block $A_2(x)$ and may output the second code [011111].

A multiplicity of sub-block CRC parts 110 may coincidently process sub-blocks A2(x), A1(x), and A0(x) to output second codes [011111], [010101], and [111101]. A Galoir field adding part 130 may generate a CRC code to the total transport block C(x) by adding the second codes in a Galoir field. Accordingly, the CRC code to C(x) may be [110111] that is made by adding all of [011111], [010101], and [111101] in the Galoir field.

Figure 5A:
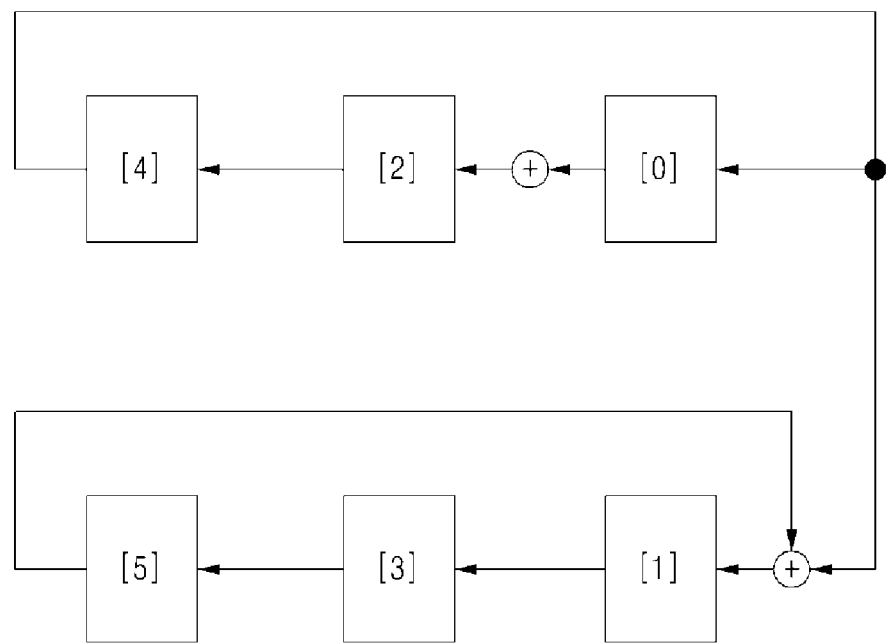
FIG. 5A is a block diagram exemplarily illustrating a 2-bit parallel linear feedback shift register.
Figure 5B:
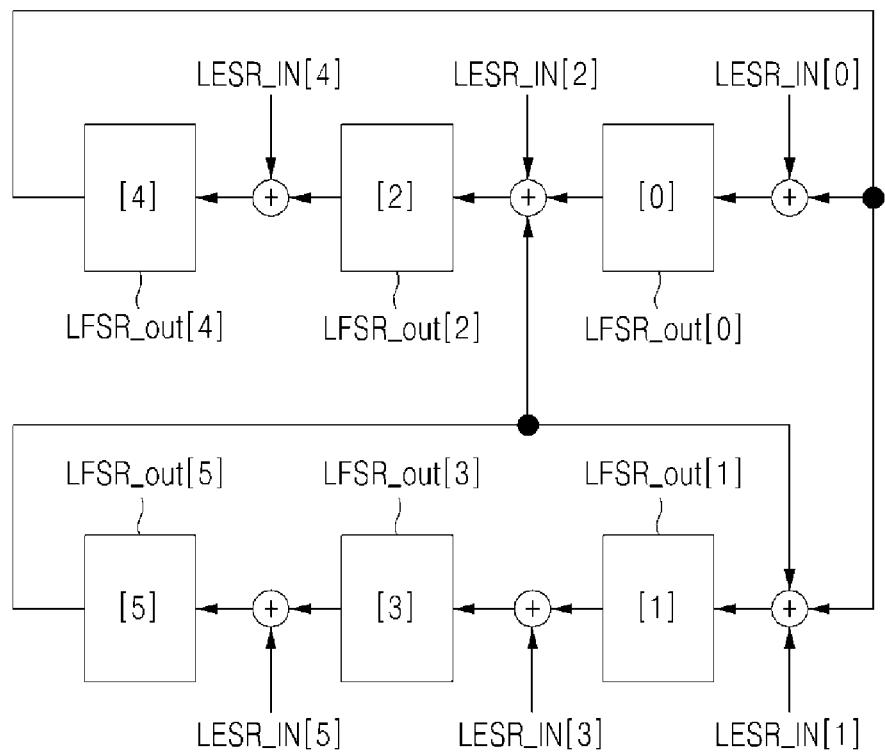
FIG. 5B is a diagram a scheme of inputting a weight bit sequence into a 2-bit serial linear feedback shift register according to an embodiment of the inventive concept.

Referring to FIGS. 5A to 5C, a calculation process of a linear feedback shift register will be described in detail in the case that the linear feedback shift register according to an embodiment of the inventive concept processes 2-bit data per cycle. In this process, the linear feedback shift register may be a 2-bit parallel linear feedback shift register.

In the case that a characteristic polynomial is $g(x)=x6+x+1$,

FIG. 5A illustrates a 2-bit parallel linear feedback shift register. As registers having outputs affecting inputs are ordered in 0 and 5, the characteristic polynomial may be given as the g(x).

FIG. 5B illustrates a 2-bit parallel linear feedback shift register included in a CRC apparatus 100 according to an embodiment of the inventive concept, in which an input value to each register may be added in a Galois field and then may be shifted by 2 bits every cycle after XOR calculation.

FIG. 5C is a table showing a calculation process of a 2-bit parallel linear feedback shift register. As illustrated in FIG. 2, a value input into the linear feedback shift register 1102 may be an output of a Galois field multiplying part 1101. As illustrated in FIG. 5C, a transport block C(x) may be divided into a multiplicity of sub-blocks and the multiplicity of sub-blocks are processed at the same time.

The divided sub-blocks may be divided into 3 bit sequences, respectively. For example, $A_2(x)$ may be divided into [10], [11], and [01]. Each bit sequence may be input into the Galois field multiplying part 1101. The Galois field multiplying part 1101 may multiply a bit sequence and a first code in a Galois field to generate a weight bit sequence which is made by applying a weight of a corresponding sub-block to each bit sequence.

A weight bit sequence of $A_2(x)$, i.e., an output of the Galois field multiplying part 1101, may be input one by one every cycle into the linear feedback shift register. As a result, the 2-bit parallel linear shift register may process 2-bit data every cycle.

Calculation of a linear feedback shift register may continue until the last data to each block is input and processed (T=3), and a calculated value of the last data may be output as a second code. Referring to FIG. 5C, a value of LFSR out at the last cycle may be a second code of a corresponding sub-block. As an example, a linear feedback shift register may receive a weight bit sequence of the sub-block $A_2(x)$ and may output the second code [011111].

A multiplicity of sub-block CRC parts 110 may coincidently process sub-blocks A2(x), A1(x), and A0(x) to output second codes [011111], [010101], and [111101]. A Galoir field adding part 130 may generate a CRC code to the total transport block C(x) by adding the second codes in a Galoir field. Accordingly, the CRC code to C(x) may be [110111] that is made by adding all of [011111], [010101], and [111101] in the Galoir field. It can be seen that this CRC code is the same with a value which is calculated through a 1-bit serial linear feedback register.

It may be allowable to shorten a time for CRC, increasing energy efficiency and an amount of processing data.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. An apparatus for cyclic redundancy check (CRC) operating with a polynomial having n degrees, the apparatus comprising:
   a multiplicity of sub-block CRC parts configured to receive in parallel a bit sequence from each sub-block of a transport block that is divided into a multiplicity of sub-blocks, and configured to perform CRC in parallel; and a Galois field adding part configured to add second codes, which are output from the multiplicity of sub-block CRC parts, in a Galois field, wherein each sub-block CRC part comprises:
a Galois field multiplying part configured to generate a weight bit sequence by multiplying a first code, which is obtained from CRC calculation of a sub-block weight code that represents a weight allocated to each sub-block, and the bit sequence in the Galois field; and a linear feedback shift register including n-numbered registers and configured to output the second code by adding the weight bit sequence to each register in the Galois field.

2. The apparatus of claim 1, wherein orders of sub-blocks of the transport block increase toward a most significant bit from a least significant bit, wherein, if an order of a sub-block is P and a size of the sub-block is N, the number of bit of a sub-block weight code of the sub-block is (P−1)×N+1, a most significant bit of the sub-block weight code is 1, and the rest bits of the sub-block weight code are 0.

3. The apparatus of claim 1, if a size of a sub-block is N and an order of a corresponding sub-block of the transport block is P, further comprising:

a storage unit configured to store a reference weight CRC code that is preliminarily obtained through CRC calculation of a code that has the number of bits of N+1, a most significant bit of 1, and the rest bits of 0; and a first code generating part configured to generate a first code from a corresponding sub-block by multiplying the reference weight CRC codes, which are counted by subtracting 1 from P, in the Galois field.

4. The apparatus of claim 1, wherein, provided a size of the bit sequence is S, if S=1, the linear feedback shift register is a 1-bit serial linear feedback shift register that calculates 1 bit per one cycle, and if S>1, the linear feedback shift register is an S-bit parallel linear feedback shift register that calculates S bits per one cycle.

5. A method for cyclic redundancy check (CRC) operating with a polynomial having n degrees, the method comprising:
receiving, in parallel, a bit sequence from each sub-block of a transport block that is divided into a multiplicity of sub-blocks;

generating a weight bit sequence by multiplying a first code, which is obtained from CRC calculation of a sub-block weight code that represents a weight allocated to each sub-block, and the bit sequence in a Galois field;

outputting a second code by adding the weight bit sequence to n-numbered registers, which are included a linear feedback shift register, in the Galois field; and adding the second codes to the multiplicity of sub-blocks in the Galois field.

6. The method of claim 5, wherein the generating of the weight bit sequence further comprises:
invoking a reference weight CRC code, which is obtained by CRC-calculating of a code that has the number of bits of N+1, a most significant bit of 1, and the rest bits of 0, from a storage unit; and generating a first code of a corresponding sub-block by multiplying the reference the weight CRC codes, which are counted by subtracting 1 from P, in the Galois field, wherein the N is a size of a corresponding sub-block, the P is an order of a corresponding sub-block of the transport block, and orders of sub-blocks of the transport block increase toward the most significant bit from a least significant bit.

7. A computer-readable storage medium configured to store a computer program that executes the method for CRC according to claim 5.

\* \* \* \* \*